United States Patent [19]
Uenoyama

[11] Patent Number: 5,305,276
[45] Date of Patent: Apr. 19, 1994

[54] NON-VOLATILE IC MEMORY
[75] Inventor: Hiromi Uenoyama, Kyoto, Japan
[73] Assignee: Rohm Co., Ltd., Kyoto, Japan
[21] Appl. No.: 943,559
[22] Filed: Sep. 11, 1992
[30] Foreign Application Priority Data
  Sep. 11, 1991 [JP] Japan .................. 3-259605
[51] Int. Cl.$^5$ .................. G11C 8/00; G11C 7/00
[52] U.S. Cl. .................. 365/230.01; 365/189.01; 365/189.05; 365/230.08
[58] Field of Search .......... 365/230.01, 230.03, 365/189.01, 189.05, 230.08; 235/380, 451, 492

[56] References Cited
U.S. PATENT DOCUMENTS

| | | | |
|---|---|---|---|
| 4,402,065 | 8/1983 | Taylor | 365/230.03 |
| 4,575,819 | 3/1986 | Amin | 365/230.01 |
| 4,610,000 | 9/1986 | Lee | 365/230.03 |
| 4,785,425 | 11/1988 | Lavelle | 365/189.01 |
| 4,982,378 | 1/1991 | Matsushita | 365/189.01 |
| 5,062,078 | 10/1991 | Arakawa | 365/189.07 |
| 5,109,359 | 4/1992 | Sakakibara et al. | 365/230.03 |
| 5,130,946 | 7/1992 | Watanabe | 365/189.01 |
| 5,200,600 | 4/1993 | Shinagawa | 235/380 |

Primary Examiner—Eugene R. LaRoche
Assistant Examiner—Tan Nguyen
Attorney, Agent, or Firm—Fay, Sharpe, Beall, Fagan, Minnich & McKee

[57] ABSTRACT

A non-volatile IC memory comprising in addition to a PROM region divided into blocks a RAM region having a capacity corresponding to one of the blocks wherein the entire data stored in the corresponding block in the PROM region designated by an address sent out from the outside is transferred to the RAM region. After data in the corresponding portion in the RAM region designated by the address is rewritten by data sent out from the outside, the data in the RAM region is written back in the corresponding block of the PROM, thereby data is rewritten by a word unit or a bit unit.

17 Claims, 3 Drawing Sheets

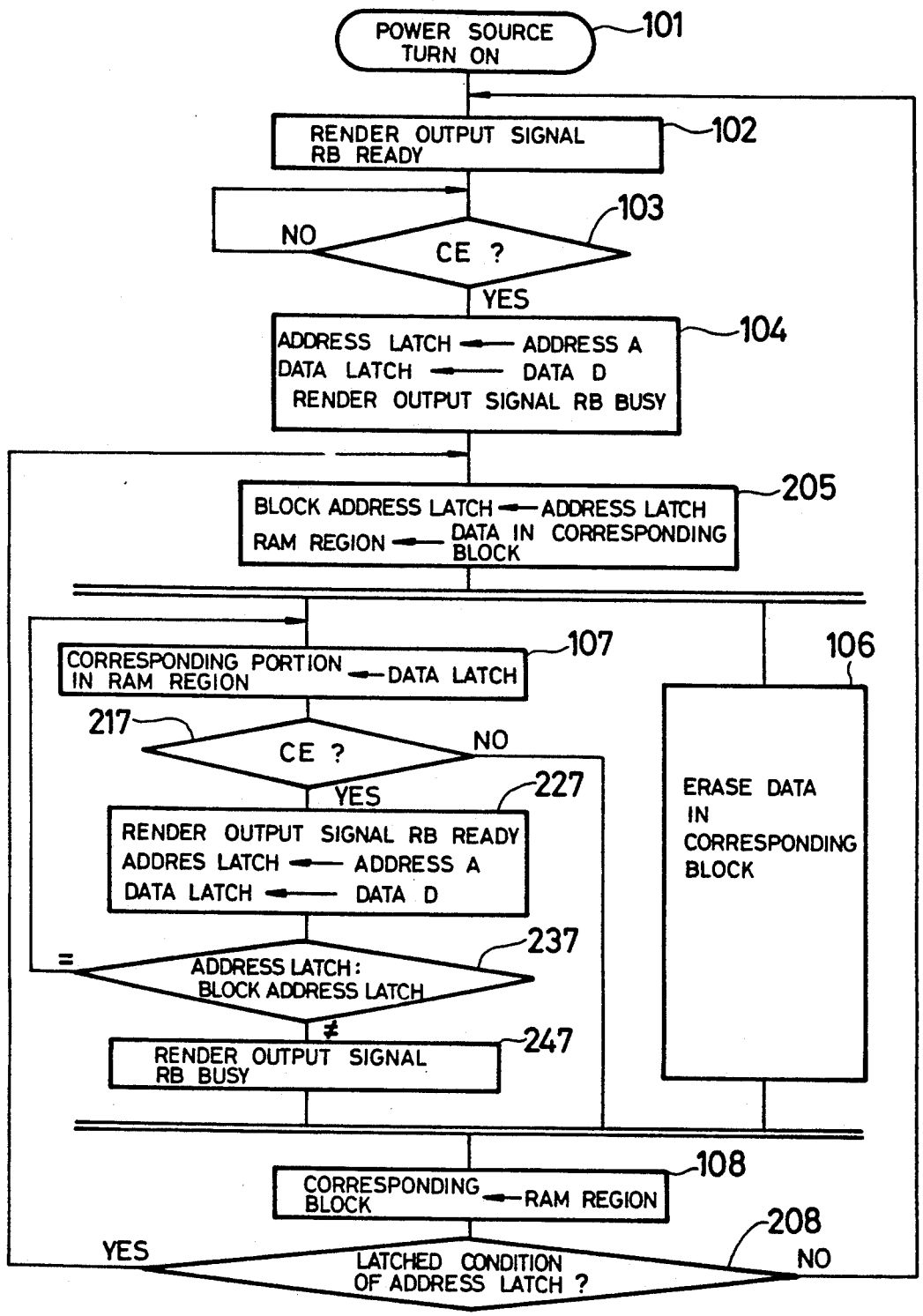

NON-VOLATILE IC MEMORY

BACKGROUND OF THE INVENTION

1. Field of the Invention

The present invention relates to a non-volatile IC memory (hereinbelow simply called as non-volatile memory) and more specifically relates to an improvement of a large capacity rewritable non-volatile memory represented by such a flash memory which requires data erasing by a block unit to a non-volatile memory which does not necessitate the data rewritting by a block unit.

2. Description of Related Art

A non-volatile memory includes a non-rewritable mask ROM and a rewritable PROM, and the PROM includes a rewritable after erasing EPROM and a rewritable after electrically erasing EEPROM.

The advantages of the EEPROM are that it endures rewritings for a relatively great number of times (100~100,000 times) and enables rewriting on-board. However most of the EEPROMs are a plurality of transistors per cell type of which storage capacity per a predetermined area is poor in comparison with that of a single transistor per cell type such as the mask ROM and an erasable with ultraviolet EPROM.

It is a current demand to increase memory capacity for resolving the above mentioned drawback of the EEPROMs, which single transistor per cell type EEPROMs have been studied to reduce them to practice and as one of the typical examples thereof a so called inclusively erasable flash memory is now reduced to practice.

The problem with regard to the capacity is resolved by changing the memory structure from that for a plurality of transistors per cell type to that for a single transistor per cell type. However, as reflections thereof advantages associated with the constitution of the plurality of transistors per cell type memory are lost. For example, the single transistor per cell type memory includes no selection transistor such that it is generally impossible to specify an individual cell and to erase only the data in the specified individual cell. In other words, when data erasing is required for the purpose of such as rewriting, it is necessary to erase an entire memory cell in the IC or, in case of a memory type wherein the inside of the memory is divided into a plurality of blocks, it is necessary to erase memory cells by a block unit.

In these kinds of the single transistor per cell type non-volatile memories, the data rewriting can not be performed by a bit unit or by a word unit (usually 4 or 8 bits) but has to be performed by at least a block unit (usually more than several thousand bits). This requirement presents a new restricting condition to the users of these non-volatile memories. Thereby the selectability thereof by the users is narrowed, and such is one of the reasons to prevent a spreading use of the flash memory.

SUMMARY OF THE INVENTION

An object of the present invention is to provide a non-volatile memory which is rewritable by a bit unit or a word unit even if the non-voltile memory is a single transistor per cell type.

Further, another object of the present invention is to provide a non-volatile memory which is rewritable a multiple of times in on-board and is used in a same way as in a RAM.

Still further, another object of the present invention is to provide a non-volatile memory having a large capacity such as a flash memory which is rewritable by a bit unit or a word unit and further is inclusively erasable.

A feature of the non-volatile memory according to the present invention is, in addition to a PROM region divided into blocks, to provide a RAM region having a capacity corresponding to that of one block, wherein the entire data stored in a block in the PROM region designated by an address sent out from the outside is transferred to the RAM region, and after rewriting the data in the corresponding portion the RAM region designated by the address with data sent out from the outside, the data in the RAM region is written back to the corresponding block thereby address is rewritten by a word unit or a bit unit.

Further specifically, the non-volatile memory according to the present invention is constituted by a rewritable PROM in which data are erasable by a block unit; a RAM having a capacity equal to or more than the capacity of a block in the PROM; a block address decoder which upon receipt of an address data designating block address (hereinafter simply called as block address) selects a block in the PROM corresponding to the block address; a local address decoder which upon receipt of a local address data designating a local address in the block address (hereinafter simply called as local address) selects corresponding portions in the selected block and in the RAM corresponding to the local address; an address latch which upon receipt of an address data (hereinafter simply called as address) from the outside latches and holds the same; a data latch which upon receipt of data from the outside latches and holds the same; and a controller including an address control unit (or address control portion of its circuit), a read control unit (or read control portion of its circuit) and a write control unit (or write control portion of its circuit), wherein the read control unit selects the corresponding block in the PROM based upon the address held in the address latch via control of the address control unit and reads out the entire data from the block, and the write control unit stores the data in the block read out via control of the read control unit in the RAM, renews the data in the corresponding portion in the RAM designated by the address held in the address latch with the data held in the data latch and writes the data in the RAM to the corresponding block from which data was originally read out.

In the non-volatile memory having the above constitution, since the address latch and the data latch are provided, the processing of address and data with the outside is performed to a result of a memory wherein the non-volatile memory were the conventional RAM. After an address and data are received from the outside, the controller transfers the data in the block corresponding to the designated address to the RAM, renews the data in the designated portion in the RAM selected by the address from the outside and thereafter writes back the data in the RAM to the corresponding block. Accordingly, in the portions in the RAM other than the designated portion for the renewed data the original data are held. Therefore, the result is equivalent as if only the data in the corresponding portion in the PROM region designated by the outside are rewritten.

At this time, when the rewriting of the data in the RAM is determined to be performed by a bit unit and the reception of data from the outside is by a bit unit, a rewriting of data by a bit unit is realized, and when the rewriting of the data in the RAM is determined to be performed by a word unit and the reception of data from the outside is by a word unit, a rewriting of data by a word unit is realized. Accordingly, when looking from the outside, the non-volatile memory of the present invention enables rewriting data by a bit unit or a word unit. Therefore, the non-volatile memory of the present invention can be treated during the use thereof as if it were a non-volatile RAM except for a simply long cycle time thereof.

Further, because of the provision of the block address latch in addition to the address latch and the data latch, in the non-volatile memory of the present invention, the write control unit transfers the data in the block corresponding to the designated address from the outside via control of the read control unit and after renewing the data in the portion designated in the RAM the block address latch holds the block address of the block. Thereafter when a subsequent address and data from the outside are received and latched, a judgement whether the newly latched block address is same as the previous block address or not is performed. With the above operation, when the new block address is judged identical to the previous block address a rewriting of data can be performed without newly reading out data in the block in the PROM region and without transferring the same to the RAM. Thereby the contents in the RAM can successively be rewritten and a high speed rewriting processing on the RAM can be performed. Thereafter, the entire data in the RAM are written in the original block from which the copy has been made to return the data thereto.

With the above processing, the rewriting of data in the same block can be performed at a high speed. As a result in almost all instances, the data can be read out from the storage region by a block unit without taking into account the time for writing back the data thereto (cycle time), such that the non-volatile memory of the present invention can be treated as if it were a non-volatile RAM during the use thereof.

BRIEF DESCRIPTION OF THE DRAWINGS

FIG. 3 is an explanatory view showing a processing sequence in another embodiment of non-volatile memories according to the present invention.

DESCRIPTION OF THE PREFERRED EMBODIMENTS

Figure 1:
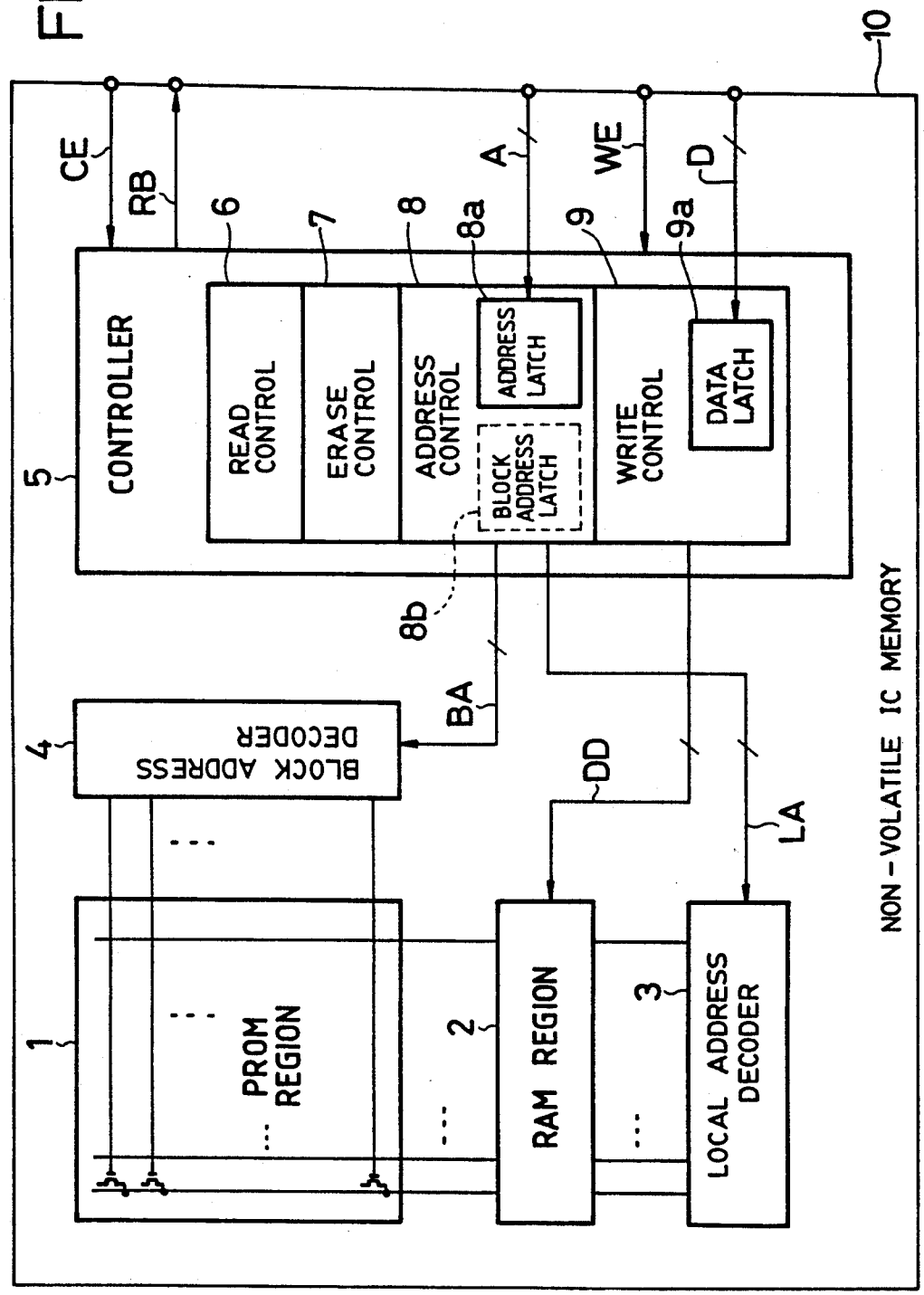
FIG. 1 is a block diagram showing the constitution of one embodiment of non-volatile memories according to the present invention.

In FIG. 1, an IC 10 is a non-volatile memory and comprises a PROM region 1, a RAM region 2, a local address decoder 3, a block address decoder 4 and a controller 5. The controller 5 includes a read control unit 6, an erase control unit 7, an address control unit 8, an address latch 8a, a write control unit 9, and a data latch 9a. The controller 5 may be constituted by gate arrays, however when the controller 5 is constituted by a microprocessor, the above mentioned control units are constituted by programs stored in an internal memory in the microprocessor and the respective control units can be realized by the microprocessor executing these programs.

In the PROM region 1, plural clusters of memory cells of EEPROM constituted by a single transistor per cell type flash memory and having a large capacity in which data can be erased and rewritten by a block unit is disposed. Further, for the convenience of explanation it is assumed that the PROM region 1 is divided into a plurality of blocks having an equal storage capacity.

In the RAM region 2, a RAM having a capacity equal to or more than that of the block having the maximum capacity among the blocks in the PROM region 1 is provided. The address of the RAM is constituted to corresponds to a local address in the respective blocks.

The block address decoder 4, upon receipt of a block address BA, generates a signal which selects a block of the blocks in the PROM region. The block address is a part of an address A sent from the outside.

The local address decoder 3, upon receipt of a local address LA, generates a signal which selects an address (the portion defined by a word unit or a bit unit) represented by the local address within the block selected by the block address decoder 4 and within the RAM region.

The address latch 8a receives the address A which is inputted from the outside via a plurality of terminals of the IC 10, latches the address A in accordance with timing of a write enabling signal WE and holds the value thereof. The data latch 9a, receives data D which is inputted from the outside via a terminal of the IC 10, latches the data D in accordance with the timing of the write enabling signal WE and holds the value thereof.

The controller 5 receives a chip enabling signal CE and the write enabling signal WE via terminals of the IC 10, outputs an output signal RB representing ready or busy and, in order to perform data exchange with the outside at the same timing as in a RAM with regard to signal exchange with the outside, controls the timing. Further, the controller 5 selectively starts or controls the read control unit 6, the erase control unit 7, the address control unit 8 and the write control unit 9, and performs a processing in which the data in the portion in the PROM region 1 corresponding to the address A held in the address latch 8a is renewed by rewriting with the data D held in the data latch 9a.

Figure 2:
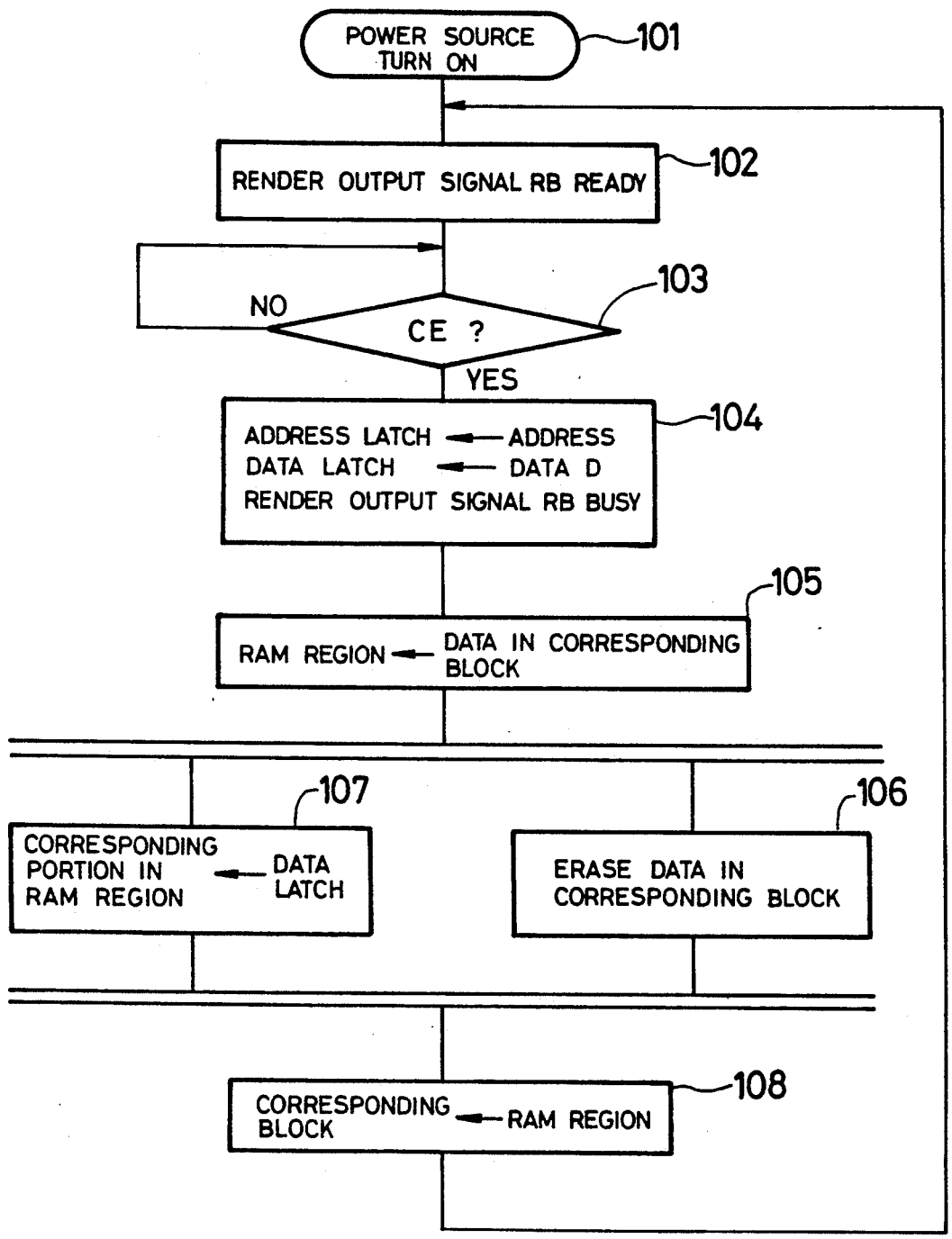
FIG. 2 is an explanatory view showing a processing sequence in the non-volatile memory shown in FIG. 1.

At first, when a power source is turned on, the controller 5 begins its operation as shown in FIG. 2 (in step 101). Under this condition the controller 5 has yet nothing to be processed such that it indicates to the outside to be in a condition of waiting by turning the output signal RB into ready (in step 102) and waits for access from the outside by monitoring a chip enabling signal CE from the outside (in step 103).

When the controller 5 receives a chip enabling signal CE, subsequently a write enabling signal WE is to be sent from the outside when rewriting is required, the controller 5 renders the address latch 8a and the data latch 9a in their operative conditions. At the leading edge of the write enabling signal WE the address A is latched at the address latch 8a. At the trailing edge of the write enabling signal WE the data D is latched at the data latch 9a. Through these operations, the controller 5 receives information for rewriting. Then, until the processing of the information is completed, the controller 5 turns the output signal RB into busy so as to indicate that it is not ready to receive subsequent information (in step 104).

The address control unit 8 generates a block address BA in response to controls of the other control units and based upon the address A latched at the address latch 8a and sends out the same to the block address decoder 4, and further, generates a local address LA based on the address A latched at the address latch 8a and sends out the same to the local address decoder 3.

Usually, a part of the address A such as upper address or lower address BA constitutes the block address and the remaining part of the address A constitutes the local address LA, therefore the address control unit 8 simply generates the block address and the local address from the address A. However, when the block address can not be obtained simply from the address A, the address control unit 8 determines the block address or the local address according to a predetermined rule based on the address A.

The controller 5 for the first time starts the write control unit 9. The write control unit 9 starts the read control unit 6. The read control unit 6 causes the block address decoder 4 to send out the block address via control of the address control unit 8, accesses the block defined by the address A among the blocks within the PROM region 1 via the block address decoder 4 and reads out the entire data from the block. The read-out entire data is transferred to the RAM region 2 and written therein by the write control unit 9. Thereby, the entire data in the block is copied in preparation for the subsequent erasing and rewriting (step 105).

Thus, after the preparation for the rewriting is completed, the controller 5 then starts the erase control unit 7. The erase control unit 7 erases the data in the corresponding block designated by the block address decoder 4 (step 106). At this instance the data is processed in parallel as much as possible for increasing the processing efficiency. For this purpose the controller 5 starts simultaneously or successively the write control unit 9. The write control unit 9 causes the local address decoder 3 to send out a local address via control of the address control unit 8, accesses the RAM region, rewrites the data in the corresponding portion (the portion designated by the local address) within the RAM region 2 represented by the address A to the data D and renews the data at this portion (step 107).

Thereafter, the write control unit 9 transfers the entire data in the RAM region 2 to the corresponding block from which the copy was made and writes the data in the corresponding block and renews the entire data in the block (step 108).

Through the above processes only the content in the portion corresponding to the address A in the PROM region 1 is renewed to the data D. Thereafter, the controller 5 returns to step 102 for receiving the subsequent information and the similar operations are repeated again from step 102.

As explained above, although complex operations are performed inside the non-volatile memory 10, from the outside only by sending the address A and the data D by making use of the chip enabling signal CE and the write enabling signal WE which are standard signals in a conventional RAM and in accordance with the ready/busy signal RB, the rewriting by a word unit (or a bit unit) can be performed. As a result, when looking from the outside circuits, the IC 10 operates and can be dealt with as if it were a RAM.

Now, the operation of another embodiment wherein a block address latch 8b (the dotted block shown in the drawing), which upon receipt of the portion corresponding to the block address BA from the address latch 8a latches and holds the same, is added to the constitution of the previous embodiment is explained with reference to the flowchart shown in FIG. 3.

Herein, the explanation beginning from the power source turning-on (step 101) to the copying of the data in the corresponding block in the RAM region 2 (the step 105 in FIG. 1 which corresponds to the latter half of step 205 in FIG. 3) is omitted because the operations therein are the same as those explained in connection with the previous embodiment. However, in the present embodiment the address control unit 8 which is controlled by the read control unit 6 sends out the block address BA among the address A held in the address latch 8a to the block address latch 8b in the former half of step 205, at the timing before the address latch 8a receives the subsequent block address from the outside. The address in the prior address A is held in the block address latch 8b. Further, in this instance, the block address latch 8b may be one that holds the entire address A.

Then after completing the preparation, the controller 5 starts the erase control unit 7. Through the operation thereof the data of the corresponding block is erased (step 106). The write control unit 9 is started simultaneously or successively by the controller 5 and via the operation thereof the data in the portion corresponding to the address A within the RAM region 2 is renewed by the data D (step 107).

Further, when a chip enabling signal CE is successively received (step 217), other rewriting information is successively supplied from the outside, therefore the controller 5 turns the output signal RB ready to request the subsequent information to the outside. Then, at the leading and trailing edges of the subsequent write enabling signal WE the subsequent address and data are latched respectively at the address latch 8a and the data latch 9a (step 227).

At this moment the prior block address BA (or address A) is held and saved in the block address latch 8b, therefore the present block address held in the address latch 8a can be compared with the prior block address. The write control unit 9 compares the block address portions among these addresses in latches 8a, 8b via control of the address control unit 8. The write control unit 9 judges whether the rewriting is a renewal with respect to the same block in accordance with the comparison result (step 237).

When the rewriting is directed to the same block, since the block in the RAM region 2 designated to be rewritten is already stored and the preparation for rewriting is completed, the write control unit 9, through the repetition of the steps from step 107, repeats at a high speed the renewal process of the data in the RAM region 2 designated by an address sent out from the outside with the data in the data latch. When the rewriting is directed to a different block, the controller 5, upon receipt of a signal from the write control unit 9, turns the output signal RB to busy so that the subsequent information is not sent thereto (step 247). On the other hand, the write control unit 9 renews the content in the block by rewriting the entire original data in the corresponding block with the renewed data in the RAM region 2 (step 108).

With the above processings, only the content in the corresponding portion within the PROM region 1 is renewed. Here, depending on whether the subsequent information is already received or not the process goes one of two ways, in that when the subsequent information is already received the processes from step 205 are again repeated to continue the processes, and on the other hand, when the subsequent information has not been received the processes from the step 102 are repeated for receiving the subsequent information.

As will be seen from the above, with the provision of the further block address latch 8b a rewriting for the same block as a prior rewriting or reading can be processed at a speed equivalent to that in the usual RAM.

Further, the constitution as well as the processing sequence with regard to mere reading out of data can be performed by merely reading out data from the PROM region in the same manner as in the conventional non-volatile memory. However, in the present embodiments, for example during data reading out the block corresponding to the address A is read out in response to a read signal which is the inverted signal of a write enabling signal WE or an output enabling signal OE and a part of the data corresponding to the address A among the data in the RAM region 2 is sent out to the outside via the data latch 9a or another data latch.

Further, in the present embodiments although the erase control unit is provided when the type of the memory which enables over writing processing by a block unit as in the present embodiments, actually the erase control unit can be eliminated. The reason why the erase control unit is provided here is that there is a type of memory in which only one value of "0" and "1" can be written in and the writing in operation is performed by uniformly setting the entire data in the block into one of the other value of "0" and "1" by inclusively erasing beforehand, still further this kind of memory is quite popular and there is a necessity to meet such requirement.

Further, in the present embodiments the read control unit 6, the address control unit 8 and the write control unit 9 are provided separately and the address control unit 8 is controlled by the read control unit 6 and the write control unit 9, however the address control unit 8 may be provided inside the respective control units and incorporated therein without being provided independently from the read control unit 6 and the write control unit 9. Still further, instead of controlling the read control unit and the address control unit via the write control unit the controller 5 may be designed to control and start the respective control units.

Moreover, in the present embodiments, blocks having an equal capacity are exemplified, however when the capacity of the respective blocks is different, the capacity of the RAM is determined to be equal to or more than that of the block having the maximum capacity.

While a preferred embodiment has been set forth with specific details, further embodiments, modifications and variations are contemplated according to the broader aspects of the present invention, all as determined by the spirit and scope of the following claims.

I claim:

1. A non-volatile IC memory comprising:
    a PROM region which is divided into blocks having block addresses;
    a RAM region of capacity corresponding to at least the largest one of said blocks; and
    a memory write controller which performs a memory write cycle that transfers all data stored in one of the blocks in said PROM region, which block is designated by a block address portion of an address sent out from the outside, to said RAM region, thereafter rewrites a part of the data in a corresponding portion in said RAM region designated by a local address portion of the address with data sent out from the outside, and thereafter writes all of the data in said RAM region that corresponds to the one of said blocks into the corresponding one of said blocks of said PROM.

2. A non-volatile IC memory according to claim 1, wherein said PROM region is a single transistor per memory cell type having no selection transistor per cell so that it is generally impossible to specify an individual cell and to read or write individual cells within a block without reading or writing all individual cells of the block.

3. A non-volatile IC memory according to claim 1, further including:
    a block address latch for storing at least the block address of an immediately preceding completed read cycle or write cycle independently of an address of a current read cycle or write cycle, to thereby indicate the block of the data in the RAM region upon receipt of the current address;
    means comparing the block address portion of the current address with the block address portion stored in the block address latch means and producing a corresponding one of a match output or a no match output; and
    said controller reading data from a block of the PROM region corresponding to the current block address into the RAM region only in response to the no match output and bypasses reading of data from the PROM region into the RAM region in response to the match output.

4. A non-volatile IC memory which includes a PROM region divided into blocks and enabling data rewriting electrically by a block unit comprising,
    a RAM region having a capacity equal to or more than the capacity of the largest one of the blocks in said PROM region;
    an address latch which upon receipt of an address from the outside latches the same;
    a data latch which upon receipt of data to be written-in from the outside latches the same; and
    a memory write controller which performs a memory write cycle that reads out the entire data from one of the blocks within said PROM region, which block is selected by a block address portion of the address latched in said address latch, thereafter writes in the entire data into said RAM region, thereafter rewrites data in a corresponding portion in said RAM region selected by a local address portion of the address with data to be written-in latched in said data latch, and thereafter writes-in all the data in said RAM region that corresponds to the one of said blocks into the corresponding one of said blocks in said PROM region.

5. A non-volatile IC memory according to claim 4, wherein said PROM region is a single transistor per memory cell type having no selection transistor per cell so that it is generally impossible to specify an individual cell and to read or write individual cells within a block without reading or writing all individual cells of the block.

6. A non-volatile IC memory according to claim 4, further including:
    a block address latch for storing at least the block address of an immediately preceding completed read cycle or write cycle independently of an address of a current read cycle or write cycle, to thereby indicate the block of the data in the RAM region upon receipt of the current address;

means comparing the block address portion of the current address with the block address portion stored in the block address latch means and producing a corresponding one of a match output or a no match output; and said controller reading data from a block of the PROM region corresponding to the current block address into the RAM region only in response to the no match output and bypasses reading of data from the PROM region into the RAM region in response to the match output.

7. A non-volatile IC memory comprising, a PROM region enabling data rewriting electrically by a block unit comprising, a RAM region having a capacity equal to or more than the capacity of one of blocks in said PROM region;

an address latch which upon receipt of address data from the outside latches the same;

a data latch which upon receipt of data to be written-in from the outside latches the same;

a controller which reads out the entire data from one of the blocks within said PROM region selected by the address data latched in said address latch, writes in the entire data in said RAM region, rewrites data in the portion in said RAM region selected by the address data by the data to be written-in latched in said data latch and writes-in the same in the corresponding block;

a block address decoder which upon receipt of a block address selects one of the blocks in said PROM region designated by the block address; and a local address decoder which upon receipt of a local address selects corresponding portions designated by the local address in the selected block and in said RAM region, wherein said controller generates the block address and the local address from the address data, and sends out the block address to said block address decoder and the local address to said local address decoder.

8. A non-volatile IC memory according to claim 7, wherein said controller includes a read control unit and a write control unit, said read control unit generates the block address based upon the address data, sends out the same to said block address decoder and reads out the entire data in the corresponding block designated by the block address, and said write control unit writes in the entire data in the corresponding block read out by said read control unit in said RAM region, generates the local address based upon the address data, sends out the same to said local address decoder, rewrites the data in the corresponding portion in said RAM region designated by the local address by the data to be written in and writes in the data in said RAM region in the corresponding block.

9. A non-volatile IC memory according to claim 7, wherein said controller includes an address control unit, a read control unit and a write control unit, said address control unit generates the block address based upon said address decoder, sends out the same to said block address decoder, generates the local address based upon the address data and sends out the same to said local address decoder, said read control unit reads out the entire data from the corresponding block designated by the block address via control of said address control unit, and said write control unit writes in the entire data read out by said read control unit in said RAM region, rewrites the data in the corresponding portion in said RAM region designated by the local address by the data to be written in via control of said address control unit and writes in the data in said RAM region in the corresponding block.

10. A non-volatile IC memory according to claim 9, wherein said address latch serves as a first address latch and further comprising a second address latch which latches a part of the data at least corresponding to the block address among the address data latched in said first latch at the timing before said first address latch subsequently latches an address data from the outside, said write control unit compares the portion corresponding to the block address among the address data latched in said first latch with the portion corresponding to the block address among the data latched in said second address latch, and when these portions coincide, generates the local address obtained based upon the address data in said first address latch, accesses said RAM region and rewrites the data in the corresponding portion in said RAM region designated by the local address with the data to be written in.

11. A non-volatile IC memory according to claim 10, wherein said PROM region is constituted by an EEPROM and said RAM region is constituted by a RAM.

12. A non-volatile IC memory according to claim 11, wherein said EEPROM is constituted by a single transistor per cell type flash memory.

13. A non-volatile IC memory according to claim 11, wherein said controller is a microprocessor and said address control unit, said read control unit and said write control unit are constituted by programs executed by said microprocessor.

14. A non-volatile IC memory which includes a PROM region enabling data rewriting electrically by a block unit comprising, a RAM region having a capacity equal to or more than that of one of blocks in said PROM region;

a block address decoder which upon receipt of a block address selects corresponding one of blocks in said PROM region;

a local address decoder which upon receipt of a local address selects the corresponding portions in the selected block and in said RAM region;

a first storage circuit which upon receipt of an address data from the outside stores the same;

a second storage circuit which upon receipt of data from the outside stores the same; and a controller which includes an address control portion, a read control portion and a write control portion, characterized in that, said read control portion selects the corresponding block in said PROM region based upon the address data stored in said first storage circuit via control of said address control portion and reads out the entire data therefrom, and said write control portion stores the entire data in the corresponding block read out in said RAM region via control of said read control portion, renews the data in the corresponding portion in said RAM region selected based upon the address data with the data held in said second storage circuit and writes in the data in said RAM region in the corresponding block via control of said address control portion.

15. A non-volatile IC memory which includes a PROM region enabling data erasing and rewriting by a block unit comprising, a RAM having a capacity more than one of blocks in said PROM region, a block address decoder which upon receipt of a block address selects a corresponding block in said PROM region;

a local address decoder which upon receipt of a local address selects corresponding designated portions in the selected block and in said RAM;

an address latch which upon receipt of an address data latches the same;

a block address latch which upon receipt of the data corresponding to the block address among the address data latches the same;

a data latch which upon receipt of data to be written-in from the outside latches the same; and a controller which includes an address control means, a read control means and a write control means, said read control means reads out data from the corresponding block in said PROM region selected based upon the address data via control of said address control means and, said write control means transfers the data read out to said RAM via control of said read control means and stores the same, renews data in the corresponding portion in said RAM selected based upon the address data with the data to be written-in, further when the subsequent address data received from the outside designates an address in the corresponding block and a writing in command from the outside is generated, in response thereto renews data in the corresponding portion in said RAM selected based upon the address data subsequently received from the outside with the data to be written in held together with the address data subsequently received from the outside, and writes in the data in said RAM in the corresponding block via control of said address control means.

16. A non-volatile IC memory, comprising:

a PROM region divided into blocks and enabling data rewriting and reading by block units;

a RAM region having a capacity equal to at least the capacity of the largest one of the blocks of said PROM region;

a controller which performs each of a memory write cycle and a memory read cycle by reading out the entire data from one of the blocks within the PROM region, which block is selected by a block address portion of address data from outside, thereafter writes in the entire data into said RAM region, thereafter writes or reads data in the RAM region with respect to the outside in response to a local address portion of the address from the outside;

a block address latch for storing at least the block address of an immediately preceding completed read cycle or write cycle independently of an address of a current read cycle or write cycle, to thereby indicate the block of the data in the RAM region upon receipt of the current address;

means comparing the block address portion of the current address with the block address portion stored in the block address latch means and producing a corresponding one of a match output or a no match output; and said controller reading data from a block of the PROM region corresponding to the current block address into the RAM region only in response to the no match output and bypasses reading of data from the PROM region into the RAM region in response to the match output.

17. A non-volatile IC memory according to claim 16, wherein said PROM region is constituted by a single transistor per memory cell type flash memory that is electrically erasable and writable.

* * * * *